United States Patent
Jensen

(10) Patent No.: US 7,619,898 B2
(45) Date of Patent: Nov. 17, 2009

(54) CONTROL BOX FOR ELECTRICAL ACTUATORS, ESPECIALLY FOR ADJUSTABLE FURNITURE

(75) Inventor: Svend Erik Knudsen Jensen, Sønderborg (DK)

(73) Assignee: Linak A/S, Nordborg (DK)

(*) Notice: Subject to any disclaimer, the term of this patent is extended or adjusted under 35 U.S.C. 154(b) by 167 days.

(21) Appl. No.: 11/667,491

(22) PCT Filed: Nov. 23, 2005

(86) PCT No.: PCT/DK2005/000748
§ 371 (c)(1),
(2), (4) Date: May 10, 2007

(87) PCT Pub. No.: WO2006/056200
PCT Pub. Date: Jun. 1, 2006

(65) Prior Publication Data
US 2007/0297150 A1    Dec. 27, 2007

(30) Foreign Application Priority Data
Nov. 23, 2004  (DK) ............................... 2004 01822

(51) Int. Cl.
*H05K 1/14* (2006.01)
(52) U.S. Cl. .................. 361/736; 361/715; 361/800
(58) Field of Classification Search ............... 361/736, 361/715, 752, 790, 797, 800
See application file for complete search history.

(56) References Cited
U.S. PATENT DOCUMENTS

| | | | |
|---|---|---|---|
| 5,737,189 A * | 4/1998 | Kammersgard et al. | 361/726 |
| 5,984,734 A * | 11/1999 | Piper et al. | 439/717 |
| 6,081,048 A * | 6/2000 | Bergmann et al. | 307/147 |
| 6,123,585 A * | 9/2000 | Hussong et al. | 439/652 |
| 6,916,194 B2 * | 7/2005 | Sichner et al. | 439/271 |
| 7,021,974 B2 | 4/2006 | Sichner et al. | |
| 2004/0082214 A1 | 4/2004 | Lafragette et al. | |

* cited by examiner

*Primary Examiner*—Hung S Bui
(74) *Attorney, Agent, or Firm*—Dykema Gossett PLLC

(57) ABSTRACT

A control box for electrical actuators comprises a cabinet consisting of a lower part (2) containing a control printed circuit board and provided with a row of gates (3) for various plugs, and an upper part (4) with a power supply and optionally also a battery pack. The lower part (2) is configured as an independent closed housing, and the upper part (4) is configured as two independent closed housings (5, 6). The upper side of the lower part (2) is provided with an area (7) for receiving a lower side of the two independent housings (5, 6) of the upper part, and means (13, 14; 16, 17) are provided in the lower part and the two housings of the upper part for securing the housings of the upper part to the lower part. The two housings of the upper part do not or essentially do not extend outside the area on the upper part.

9 Claims, 4 Drawing Sheets

CONTROL BOX FOR ELECTRICAL ACTUATORS, ESPECIALLY FOR ADJUSTABLE FURNITURE

BACKGROUND OF THE INVENTION

1. Field of the Invention

The invention relates to a control box for electrical actuators, preferably for adjustable articles of furniture.

2. The Prior Art

In furniture, e.g., actuators are used for causing the adjusting of the article of furniture. It may, e.g., be the adjustment of the support face for a mattress in a bed, the backrest of a chair, height adjustment of tables, etc.

The actuator or actuators is/are connected by a cable to a control box, which contains control electronics, a power supply connected to the mains, and optionally a battery pack consisting of rechargeable batteries or a floating battery. The control box also has connections for at least one hand-set and optionally additional control panels. Examples of hospital beds are described in EP 488 552 to J. Nesbit Evans & Co. Ltd. as well as in we 01/47340 to Hill-Rom Services, Inc.

Figure 1:
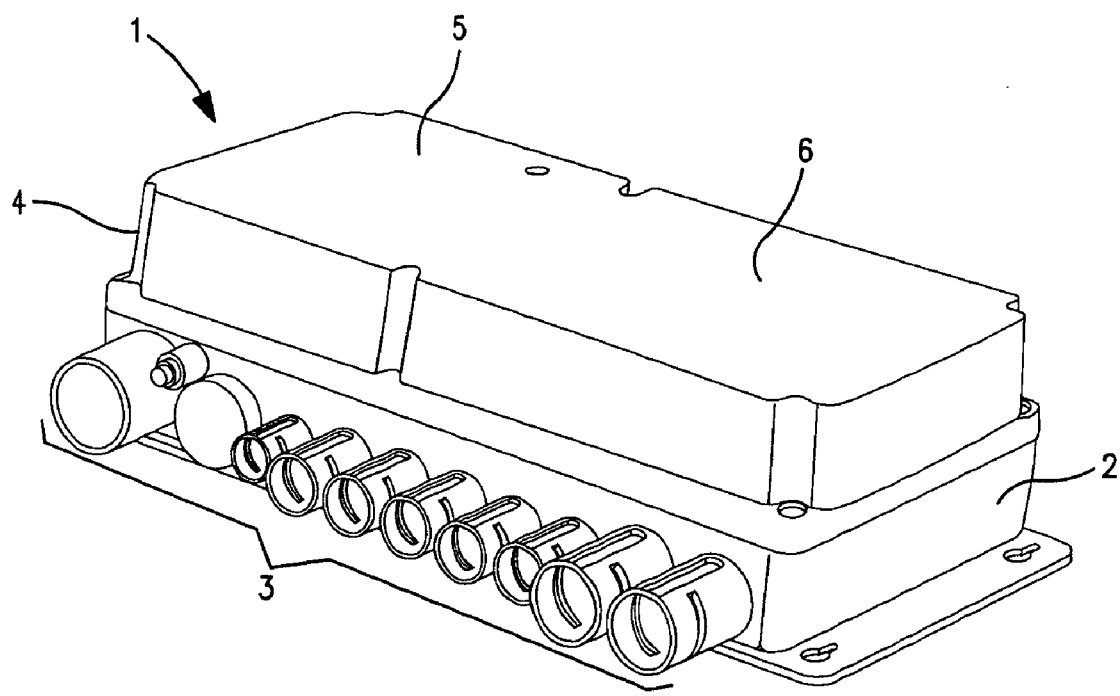

An example of such a control box is shown in FIG. 1. It is a control box from LINAK A/S having the type designation CB12. The control box consists of a cabinet 1 with a lower part 2 containing a control printed circuit board and provided with a row of gates 3 perpendicularly from the lower part for various plugs. An upper part 4, divided into two compartments 5, 6, is secured to the lower part 1 by screws, where a transformer for the power supply is arranged in the one compartment 5, and a battery pack is arranged in the other compartment 6.

The control box is excellent, except that it is constructed rigidly, i.e., it must be determined from the beginning whether it is to be dedicated to a specific purpose, or whether a standard version is to be made, which is overdimensioned in certain cases. In addition, the box takes up disproportionately much space.

The object of the invention is to provide a more flexible configuration of the control box thus known.

SUMMARY OF THE INVENTION

This is achieved according to the invention wherein the lower part is constructed as an independent closed housing and the upper part as two independent closed housings. In this way it is possible to construct a control box from a plurality of basic modules which satisfies given specifications, and at the same time it is also easier to repair a defective control box merely by replacing the defective module. Further, it is also easier to make future upgradings and adaptations of the control box by replacing a module.

Further features of the invention will appear from the attached drawings, taken in conjunction with the following discussion.

Figure 2:
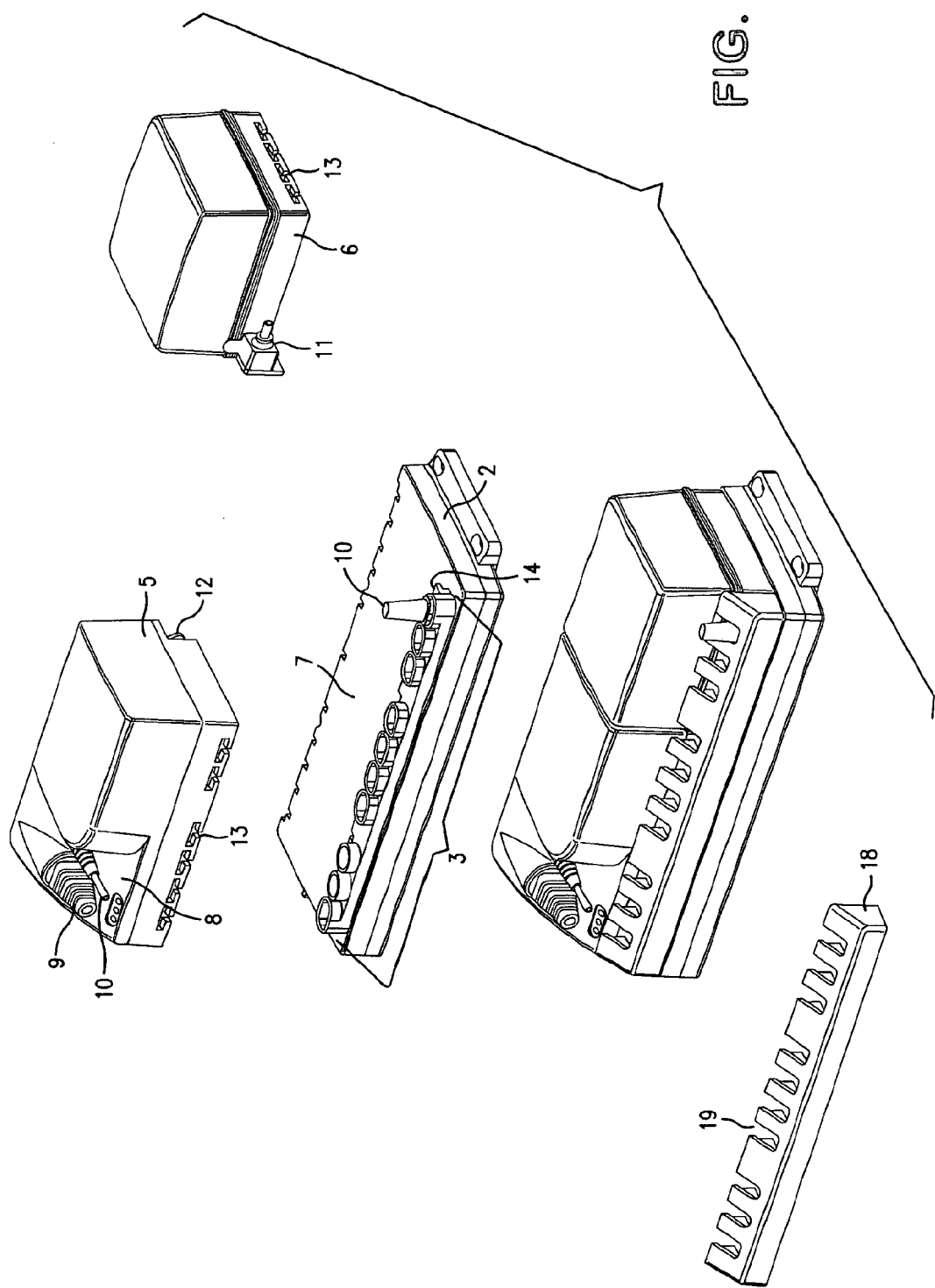
Figure 3:
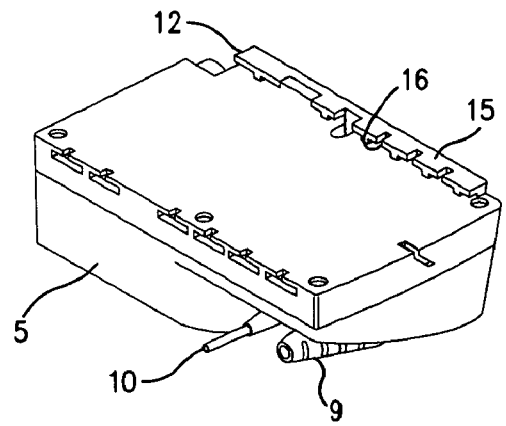
Figure 4:
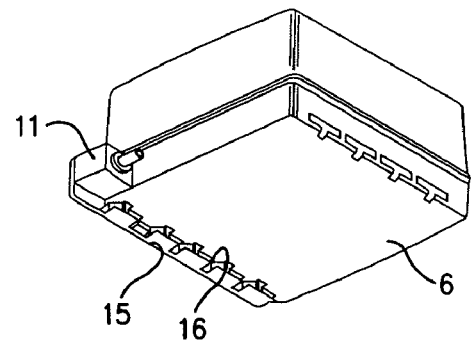
Figure 5:
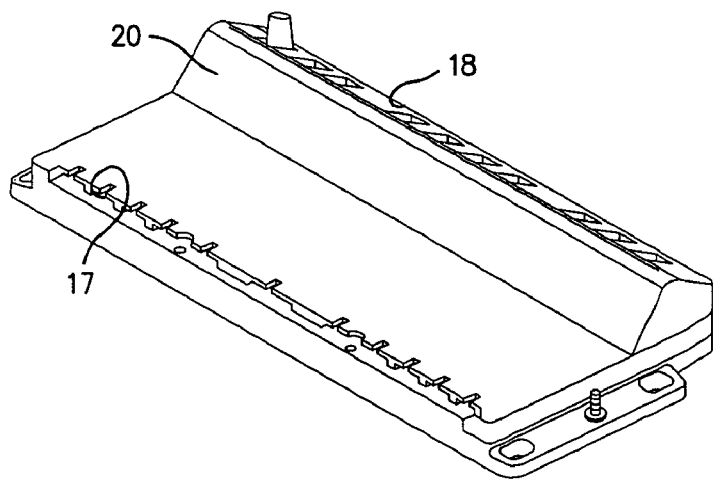
Figure 6:
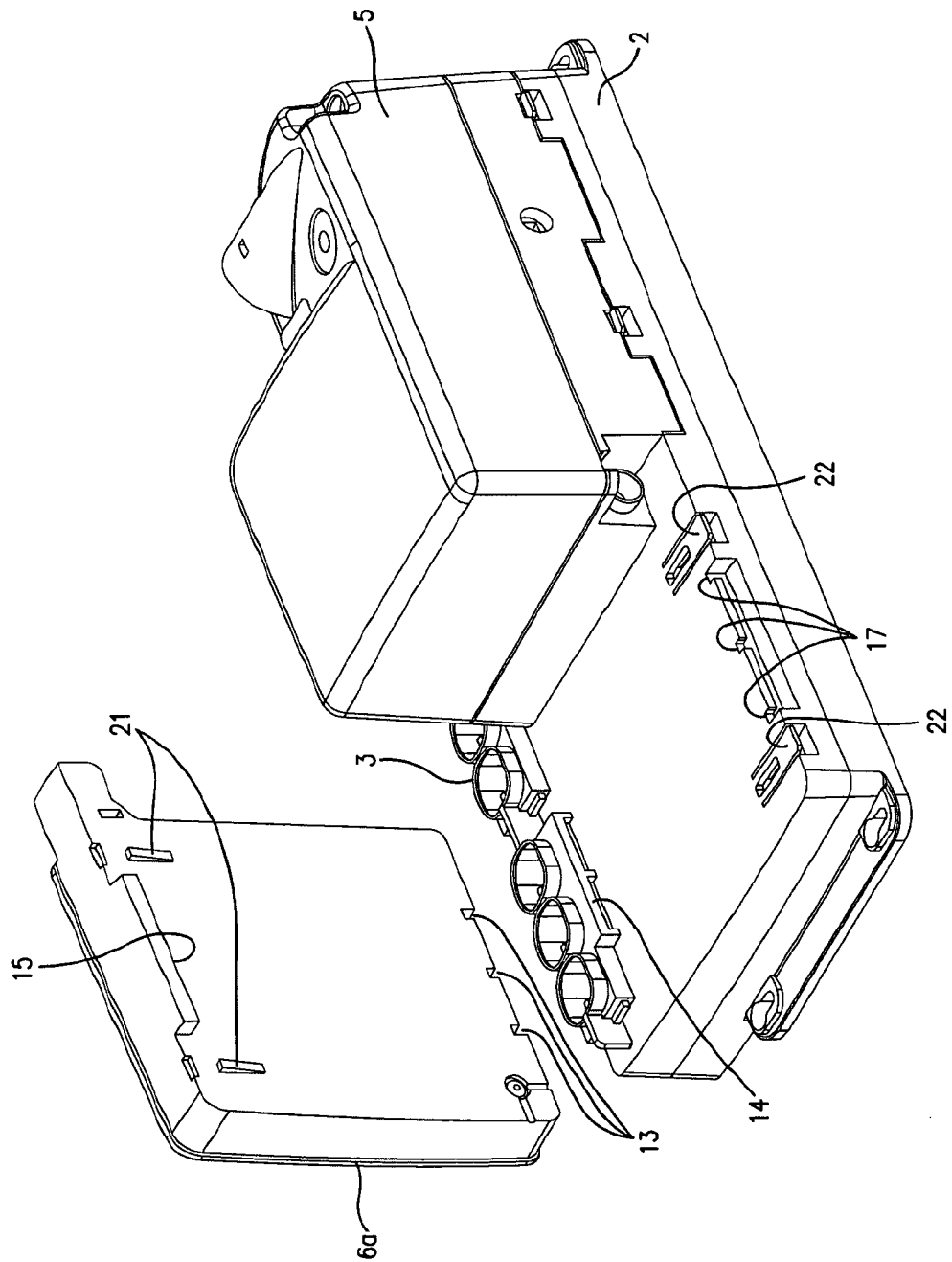

FIG. 1 shows a perspective view of a known control box,

FIG. 2 shows an exploded view of a control box according to the invention, shown in an assembled stated, FIG. 3 shows the box for the power supply, seen from below, FIG. 4 shows the box for the battery pack, seen from below, FIG. 5 shows the lower part, seen from above, with a locking element for plugs, and FIG. 6 shows the control box, seen from behind, with a slightly different configuration of the locking connection.

DETAILED DESCRIPTION OF THE PREFERRED EMBODIMENTS

The control box according to the invention, as shown in FIGS. 2 to 6, are particularly intended for hospital and nursing beds as well as therapy beds.

As will appear from FIG. 2, the control box comprises a lower part 2 in the form of a flat rectangular closed box-shaped housing with a plane area 7 on the upper side. Along the one long side of the lower part, this plane area 7 is defined by an elevation having a plurality of upstanding gates 3 for various cable connections to a control printed circuit board contained in the lower part 2. The gates are used for the connection of actuators, handsets and optionally foot controls as well as control panels, e.g., ACP. Two closed box-shaped housings 5, 6, which constitute the upper part 4 of the control box, may be arranged on the plane area 7 of the lower part 2. The one housing 5 contains a power supply which is connected to the mains and is based on a transformer. The upper side of the housing 5 is inclined 8 at one end with a gate for a mains cable 9. The power supply is connected to the control printed circuit board in the lower part 2 by a cable 10, for which a gate is provided at the side of the mains cable 9. The inclined portion 8 and the gates are configured such that the plugs on the cables 9, 10 as a whole are disposed within the circumscribed rectangular box of the control box. The height of the housing 5 and the gates 3 in the lower part 2 are configured such that the plugs therein are likewise disposed within the circumscribed rectangular box of the control box. The other housing 6 of the upper part corresponds essentially to the first one, apart from the area with the mains connection cable, and it contains a battery pack consisting of rechargeable batteries. A plate member with a plug 11 protrudes from the side of the housing 6. In the first housing 5, at the adjoining corner, there is a notch 12 for receiving the plug 11 and with a gate for this for mutual electrical connection of the two housings. The two housings 5, 6 are secured to the lower part 2 as follows: A plurality of T-shaped slots 13 are provided at the lower side in the side of the housings 5, 6 which face toward the row of gates 3, said slots engaging a strip 14 with slots on the row of gates 3. The lower side of the housings 5, 6 is configured with an L-shaped strip 15, where the free flange is configured with slots 16. A plurality of T-shaped slots are provided on the upper side in the long side of the lower part 2 opposite the row of gates 3. When the two housings 5, 6 from the rear side are slid inwards on the upper side 7 of the lower part, the two sets of the slots 13, 14; 16, 17 are mutually engaged, whereby the lower part 2 and the housings 5, 6, which constitute the upper part 4, are mutually locked. For this purpose, releasable snap lock connections are provided in the slots 17 along the long side of the lower part 2.

In order to lock the plugs in the row of gates 3, there is a beam-shaped locking element 18 with recesses 19, which can just accommodate the outer end of the plugs. The beam is slid from the side inwards over the row of gates 3 with the plugs and is secured in a snap lock connection to the lower part 2, whereby the plugs are locked against unintentional withdrawal.

In the event that the control box cannot be mounted for some reason, e.g. owing to lacking height at the location where the control box is to be arranged, the parts of the box may be mounted separately. For this purpose, the gates 3 in the lower part 2 may be covered by a cover plate 20 in cooperation with the locking element 18, as will appear from FIG. 5.

FIG. 6 shows a configuration of the control box with a slightly different configuration of the locking connection. The lower side of the housing 6, of which only a lower part 6a is shown, is provided with two bosses 21 intended to cooperate with two resilient legs 22 in the lower part 2. The two resilient legs 22 have an opening for receiving the two bosses 21 on the housing 6. The bosses 21 are configured as an inclined plane so that they may easily be slid on to the resilient legs 22 and lockingly rest on the rim of the opening therein with a straight terminating end. To release the locking connection, the two resilient legs 22 are pressed down into the underlying recess, so that the bosses 21 on the lower side of the housing clear them. The L-shaped strip 15 has three ribs, two of which constitute end walls, and these ribs are fitted in slots 17 in a notch in the lower part. The notch accommodates the entire L-shaped strip. Forwardly on the lower side of the housing 6, there are three T-shaped slots 13 which engage a strip 14 behind the row of gates on the lower part 2. The strip 14 is received in a notch in the housing 6 where the slots 13 are positioned. The two outermost T-shaped slots 13 are one-sided so as to match the two outermost ribs, which simultaneously constitute end walls of the strip 14.

Since the lower part 2 and the housings 5, 6 are of a relatively modest volume, they are also simpler and easier to make moisture- and waterproof. The inaccuracies which are a consequence of a large cabinet, are obviated here.

The invention claimed is:

1. A control box for electrical actuators in the form of a cabinet which comprises:
   a lower part configured as a one-piece closed housing and which contains a control printed circuit board and includes a row of gates for electrical plugs, said lower part including a top surface defining a periphery,
   an upper part comprising a first closed housing containing a power supply and a separate second closed housing, each of said first and second housings defining a lower side positionable on the top surface of the lower part, and
   the first and second housings of the upper parts, when positioned on the lower part, not extending substantially beyond the periphery of the top surface of the lower part.

2. The control box according to claim 1, wherein the lower part is configured as a flat rectangular box having a planar top surface.

3. The control box according to claim 1, wherein the gates are arranged along a long side of the lower part and adjoining the first and second housings of the upper part, extending upwardly from the lower part.

4. The control box according to claim 1, wherein an upper side of the first closed box of the upper part is inclined at one end with a gate for a mains cable, so a plug for the mains cable is disposed within the circumscribed rectangular box of the control box.

5. The control box according to claim 4, wherein the first closed box supply is connected to the control printed circuit board by a cable, for which there is a gate at the side of the mains cable.

6. The control box according to claim 1, wherein the second closed box includes a battery pack, and including a plate member with a plug protruding from the second closed box, and including a notch in the first closed box at an adjoining corner for receiving the plug and with a gate for mutual electrical connection of the first and second closed boxes.

7. The control box according to claim 1, wherein the first and second boxes of the upper part are secured to the lower part in that the lower side at the side of the boxes facing toward the row of gates is configured with a plurality of T-shaped slots which engage a strip with slots on the row of gates, and the lower side of the boxes is provided with an L-shaped strip where a free flange is configured with slots, and a row of T-shaped slots are provided on the upper side in the long side opposite the row of gates, so that when the two boxes are slid from the side on to the upper side of the lower part, the two sets of slots are mutually engaged, whereby the lower part and the boxes which constitute the upper part, are mutually locked.

8. The control box according to claim 7, wherein the slots along the long side of the lower part include releasable snap lock connections.

9. The control box according to claim 1, including a beam-shaped locking element with recesses which can accommodate outer ends of the electrical plugs, and the beam may be slid from the side inwards over the row of gates with the plugs and be secured in a snap lock connection to the lower part, whereby the plugs are locked against unintentional withdrawal.

* * * * *